United States Patent
Penmethsa et al.

(10) Patent No.: US 11,948,784 B2
(45) Date of Patent: Apr. 2, 2024

(54) TILTED PVD SOURCE WITH ROTATING PEDESTAL

(71) Applicant: Applied Materials, Inc., Santa Clara, CA (US)

(72) Inventors: Harish Penmethsa, Dublin, CA (US); Hong S. Yang, Pleasanton, CA (US); Suresh Palanisamy, Coimbatore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 6 days.

(21) Appl. No.: 17/507,252

(22) Filed: Oct. 21, 2021

(65) Prior Publication Data
US 2023/0130947 A1   Apr. 27, 2023

(51) Int. Cl.
*H01J 37/34* (2006.01)
*C23C 14/34* (2006.01)
(Continued)

(52) U.S. Cl.
CPC ...... *H01J 37/3455* (2013.01); *C23C 14/3407* (2013.01); *C23C 14/352* (2013.01);
(Continued)

(58) Field of Classification Search
CPC ............... H01J 37/3417; H01J 37/3423; H01J 37/3405; H01J 37/3408; H01J 37/3455;
(Continued)

(56) References Cited

U.S. PATENT DOCUMENTS 6,042,706 A   3/2000 Fu
6,183,614 B1  2/2001 Fu
(Continued)

FOREIGN PATENT DOCUMENTS

CN   208701195 U    4/2019
JP   03140467 A  *  6/1991
WO   02-22300 A1    3/2002

OTHER PUBLICATIONS

Japanese Abstract JP 03140467 (Year: 1991).*
(Continued)

*Primary Examiner* — Michael A Band
(74) *Attorney, Agent, or Firm* — Patterson + Sheridan, LLP

(57) ABSTRACT

Apparatus and methods for improving film uniformity in a physical vapor deposition (PVD) process are provided herein. In some embodiments, a PVD chamber includes a pedestal disposed within a processing region of the PVD chamber, the pedestal having an upper surface configured to support a substrate thereon, a first motor coupled to the pedestal, a lid assembly comprising a first target, a first magnetron disposed over a portion of the first target, and in a region of the lid assembly that is maintained at atmospheric pressure, a first actuator configured to translate the first magnetron in a first direction, a second actuator configured to translate the first magnetron in a second direction, and a system controller that is configured to cause the first magnetron to translate along at least a portion of a first path by causing the first actuator and second actuator to simultaneously translate the first magnetron.

18 Claims, 8 Drawing Sheets

(51) Int. Cl.
   *C23C 14/35*   (2006.01)
   *C23C 14/50*   (2006.01)
   *C23C 14/54*   (2006.01)

(52) U.S. Cl.
   CPC ............ *C23C 14/505* (2013.01); *C23C 14/54* (2013.01); *H01J 37/3405* (2013.01); *H01J 37/3417* (2013.01); *H01J 37/3423* (2013.01); *H01J 37/3435* (2013.01); *H01J 37/3497* (2013.01); *C23C 14/351* (2013.01)

(58) Field of Classification Search
   CPC .... H01J 37/345; C23C 14/35; C23C 14/3407; C23C 14/352; C23C 14/54
   See application file for complete search history.

(56) References Cited

U.S. PATENT DOCUMENTS

| | | | |
|---|---|---|---|
| 6,228,236 B1 | 5/2001 | Rosenstein et al. |
| 6,238,528 B1 | 5/2001 | Xu et al. |
| 6,251,242 B1 | 6/2001 | Fu et al. |
| 6,290,825 B1 | 9/2001 | Fu |
| 6,306,265 B1 | 10/2001 | Fu et al. |
| 6,398,929 B1 | 6/2002 | Chiang et al. |
| 6,406,599 B1 | 6/2002 | Subramani et al. |
| 6,413,382 B1 | 7/2002 | Wang et al. |
| 6,413,383 B1 | 7/2002 | Chiang et al. |
| 6,436,251 B2 | 8/2002 | Gopalraja et al. |
| 6,444,104 B2 | 9/2002 | Gopalraja et al. |
| 6,451,177 B1 | 9/2002 | Gopalraja et al. |
| 6,485,617 B2 | 11/2002 | Fu et al. |
| 6,497,802 B2 | 12/2002 | Fu |
| 6,582,569 B1 | 6/2003 | Chiang et al. |
| 6,627,050 B2 | 9/2003 | Miller et al. |
| 6,679,981 B1 | 1/2004 | Pan et al. |
| 6,692,617 B1 | 2/2004 | Fu et al. |
| 6,709,553 B2 | 3/2004 | Wang et al. |
| 6,730,196 B2 | 5/2004 | Wang et al. |
| 6,784,096 B2 | 8/2004 | Chen et al. |
| 6,787,006 B2 | 9/2004 | Gopalraja et al. |
| 6,790,323 B2 | 9/2004 | Fu et al. |
| 6,790,326 B2 | 9/2004 | Subramani et al. |
| 6,893,541 B2 | 5/2005 | Chiang et al. |
| 6,991,709 B2 | 1/2006 | Gopalraja et al. |
| 7,432,184 B2 * | 10/2008 | Hosokawa ........ H01L 21/67196 257/E21.414 |
| 7,618,521 B2 | 11/2009 | Fu |
| 7,846,310 B2 | 12/2010 | Gillard et al. |
| 8,460,519 B2 | 6/2013 | Ye et al. |
| 8,668,816 B2 | 3/2014 | Ding et al. |
| 8,696,875 B2 | 4/2014 | Ding et al. |
| 8,871,064 B2 | 10/2014 | Gung et al. |
| 9,096,927 B2 | 8/2015 | West et al. |
| 2002/0046945 A1 | 4/2002 | Hosokawa et al. |
| 2003/0102208 A1 | 6/2003 | Fu |
| 2004/0140205 A1 | 7/2004 | Fu et al. |
| 2006/0096851 A1 * | 5/2006 | Lavitsky ............... C23C 14/352 204/192.1 |
| 2007/0048992 A1 | 3/2007 | Hosokawa et al. |
| 2007/0000956 A1 | 5/2007 | Gopalraja et al. |
| 2012/0024694 A1 * | 2/2012 | Mullapudi .......... H01J 37/3423 204/192.12 |
| 2012/0027954 A1 | 2/2012 | Liu et al. |
| 2020/0335331 A1 | 10/2020 | Xiao et al. |
| 2021/0351024 A1 | 11/2021 | Sun et al. |
| 2022/0037136 A1 | 2/2022 | Subramani et al. |

OTHER PUBLICATIONS

"Hinge" definition. Merriam-Webster Online Dictionary [https://www.merriam-webster.com/dictionary/hinge#dictionary-entry-1].*
International Search Report dated Dec. 1, 2022 for application No. PCT/US2022/041405.

* cited by examiner

TILTED PVD SOURCE WITH ROTATING PEDESTAL

BACKGROUND

Field

Embodiments of the present disclosure generally relate to physical vapor deposition (PVD) film formation on substrates in an electronic device fabrication process, and more particularly, to apparatus and methods for improving film uniformity with a compact cathode design.

Description of the Related Art

Electronic device fabrication processes today often involve the use of a physical vapor deposition (PVD), or sputtering, process in a dedicated PVD chamber. The source of the sputtered material may a planar or rotary sputtering target formed from pure metals, alloys, or ceramic materials. A magnet array, which is typically disposed within an assembly that is often referred to as a magnetron, is used to generate a magnetic field in the vicinity of the target. During processing, a high voltage is applied to the target to generate a plasma and enable the sputtering process. Because the voltage source is negatively biased, the target may also be referred to as the "cathode." The high voltage generates an electric field inside the PVD chamber that is used to enable sputtering of the target material and generate and emit electrons from the target that are used to generate and sustain a plasma near the underside of the target. The magnet array applies an external magnetic field that traps electrons and confines the plasma close to the target. The trapped electrons can then collide with and ionize the gas atoms disposed within the processing region of the PVD chamber. The collision between the trapped electron(s) and gas atoms will cause the gas atoms to emit electrons that are used to sustain and further increase the plasma density within the processing region of the PVD chamber. The plasma may include argon atoms, positively charged argon ions, free electrons, and ionized and neutral metal atoms sputtered from the target. The argon ions are accelerated towards the target due to the negative bias and collide with a surface of the target causing atoms of the target material to be ejected therefrom. The ejected atoms of target material then travel towards the substrate and chamber shielding to incorporate into the growing thin film thereon.

PVD sputtering and control of film uniformity are especially challenging when processing large-area substrates, such as panels. As used herein, the term "panel" may refer to a large-area substrate that contains a large surface area. For example, a common panel size may be 600 mm by 600 mm. In some packaging applications, common panel materials can include polymer materials, such as Ajinomoto Build-up Film (ABF), Copper Clad Laminate (CCL), panel with polymer on top, glass, or other similar materials.

PVD film formation on large-area substrates may be performed using either planar or rotary targets as described above. In either case, the target size may be greater than 800 mm in length and exceeds 1,000 mm in some cases. In other terms, the target size may be about 20% to about 40% greater than the size of a substrate being processed. The need for such large-area targets presents particular challenges to the PVD sputtering process. For example, for precious metals, the amount of raw material required to fabricate such large-area targets is very costly. On the other hand, large-area monolithic targets formed from relatively brittle materials, such as silicon, are difficult and costly to manufacture because of their tendency to crack or break. In addition, large-area targets have relatively low power density. Therefore, very high power consumption is needed to achieve a suitable deposition rate. In addition, conventional PVD chambers are only sized to fit one large-area target at a time, which reduces throughput compared to what may be achievable if multiple targets were positioned within the process chamber. The presence of multiple targets in a chamber can allow the formation of multiple pure and compositionally differing materials. However, the presence of multiple targets in a processing chamber often leads to deposition non-uniformity issues due to the need for each of the targets to be positioned over only a portion of the surface of the substrate so that each target has a similar ability to form a film across the surface of the substrate.

Accordingly, there is a need in the art for apparatus and methods for improving film deposition uniformity while using a compact cathode and chamber design.

SUMMARY

Embodiments described herein generally relate to physical vapor deposition (PVD) film formation on substrates in an electronic device fabrication process. More particularly, embodiments described herein provide apparatus and methods for improving film uniformity with a compact cathode design.

In one embodiments, a PVD chamber includes a pedestal disposed within a processing region of the PVD chamber, the pedestal having an upper surface that is configured to support a substrate thereon, a first motor coupled to the pedestal, the first motor configured to rotate the pedestal about a first axis that is perpendicular to at least a portion of the upper surface of the pedestal, and a lid assembly housing a first target. A surface of the first target defines a portion of the processing region, and comprises a first target material. A surface area of the upper surface of the pedestal is greater than a surface area of the surface of the first target. The surface of the first target is tilted at a first angle in relation to a plane of the upper surface of the pedestal. The first target comprises one or more cooling channels configured to receive a coolant therethrough for cooling the first target. The PVD chamber includes a first magnetron disposed over a portion of the first target, and in a region of the lid assembly that is maintained at atmospheric pressure, a first actuator configured to translate the first magnetron in a first direction, a second actuator configured to translate the first magnetron in a second direction which is approximately perpendicular to the first direction, wherein the process of translating of the first magnetron, by the second actuator, comprises rotating the first magnetron about a second axis, and a system controller that is configured to cause the first magnetron to translate along at least a portion of a first path by causing the first actuator and second actuator to simultaneously translate the first magnetron.

Embodiments of the disclosure may include a physical vapor deposition (PVD) chamber, including a pedestal disposed within a processing region of the PVD chamber, the pedestal having an upper surface that is configured to support a substrate thereon, a first motor coupled to the pedestal, a lid assembly comprising a first target, a first magnetron disposed over a portion of the first target and in a region of the lid assembly that is maintained at atmospheric pressure, a first actuator configured to translate the first magnetron in a first direction, wherein translating the first magnetron, by the first actuator, comprises rotating the first magnetron about a second axis, a second actuator configured to translate the first magnetron in a second direction, and a system controller that is configured to cause the first magnetron to translate along at least a portion of a first path by causing the first actuator and second actuator to simultaneously translate the first magnetron. The first motor configured to rotate the pedestal about a first axis that is perpendicular to at least a portion of the upper surface of the pedestal. The lid assembly comprising a first target, wherein a surface of the first target defines a portion of the processing region, and comprises a first target material, a surface area of the upper surface of the pedestal is greater than a surface area of the surface of the first target, and the surface of the first target is tilted at a first angle in relation to a plane of the upper surface of the pedestal.

Embodiments of the disclosure may further include a physical vapor deposition (PVD) chamber, including a pedestal disposed within a processing region of the PVD chamber, the pedestal having an upper surface that is configured to support a substrate thereon, a first motor coupled to the pedestal, the first motor configured to rotate the pedestal about a first axis that is perpendicular to at least a portion of the upper surface of the pedestal, a lid assembly comprising a first target, a first magnetron disposed over a portion of the first target and in a region of the lid assembly that is maintained at atmospheric pressure, a first actuator configured to translate the first magnetron in a first direction, and a computer readable medium storing instructions that when executed by a processor of a system, cause the system to simultaneously cause the first motor to rotate the pedestal about the first axis, and the first actuator to translate the first magnetron in a first direction. A surface of the first target defines a portion of the processing region. The first target comprises a first target material. The surface of the first target is tilted at a first angle in relation to a plane of the upper surface of the pedestal.

Embodiments of the disclosure may further include processing system, including a transfer chamber, and a physical vapor deposition (PVD) chamber coupled to the transfer chamber. The PVD chamber includes a pedestal disposed within a processing region of the PVD chamber, the pedestal having an upper surface that is configured to support a substrate thereon, a first motor coupled to the pedestal, the first motor configured to rotate the pedestal about a first axis that is perpendicular to at least a portion of the upper surface of the pedestal, a lid assembly comprising a first target, a first magnetron disposed over a portion of the first target, and in a region of the lid assembly that is maintained at atmospheric pressure, a first actuator configured to translate the first magnetron in a first direction, a second actuator configured to translate the first magnetron, wherein translating the first magnetron, by the second actuator, comprises rotating the first magnetron about a second axis, and a system controller that is configured to cause the first magnetron to translate along at least a portion of a first path by causing the first actuator and second actuator to simultaneously translate the first magnetron. The lid assembly including a first target, wherein a surface of the first target defines a portion of the processing region, and comprises a first target material, a surface area of the upper surface of the pedestal is greater than a surface area of the surface of the first target, the surface of the first target is tilted at a first angle in relation to a plane of the upper surface of the pedestal; and the first target comprises one or more cooling channels configured to receive a coolant therethrough for cooling the first target.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
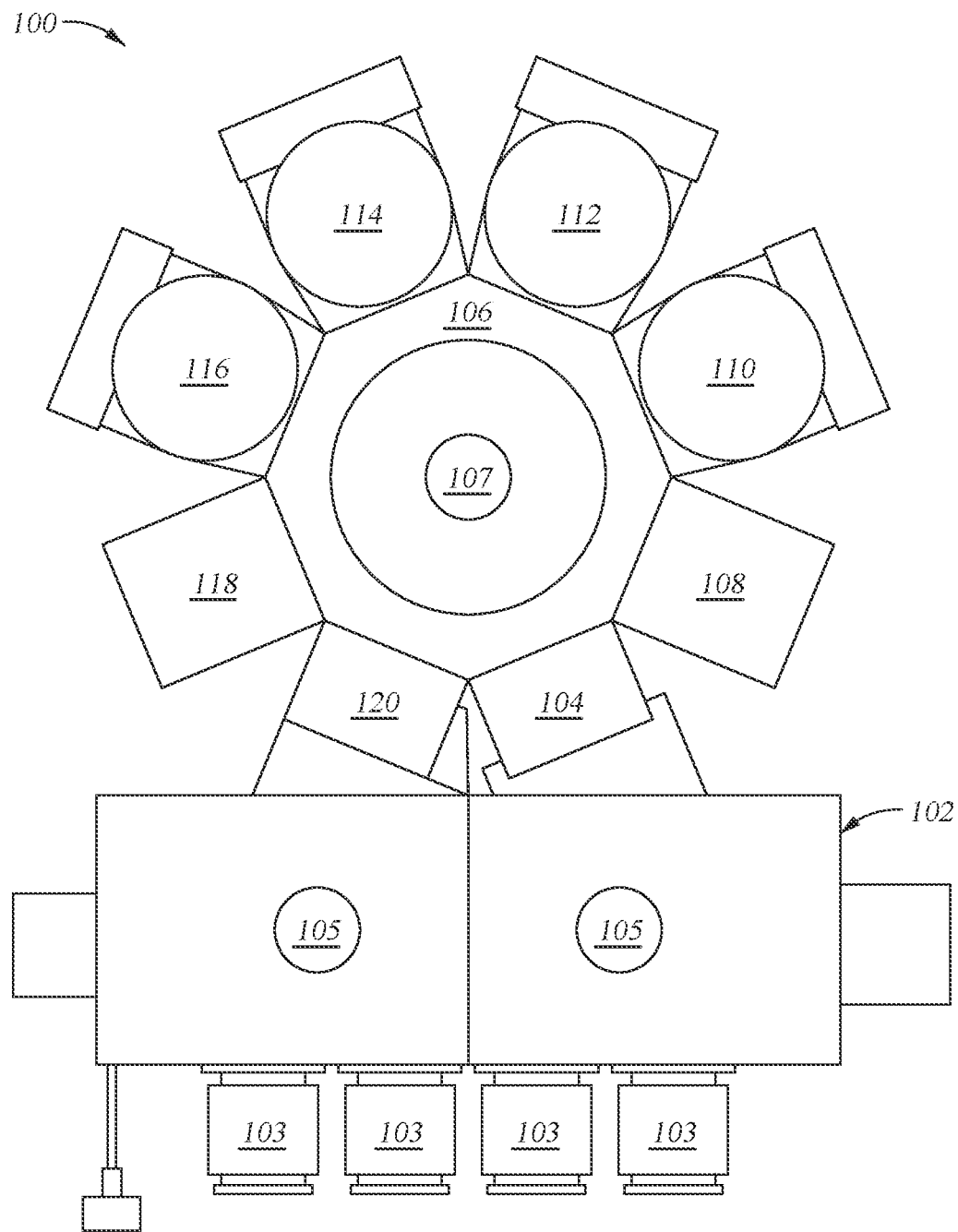
FIG. 1 is a schematic top view of an exemplary substrate processing system, according to certain embodiments.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the disclosure provided herein generally relate to physical vapor deposition (PVD) of thin films on substrates in an electronic device fabrication process. More particularly, embodiments described herein provide apparatus and methods for improving film deposition uniformity when using a compact target, or also referred to herein as a compact cathode, cathode or target. In some embodiments, the apparatus may include substrate supporting elements that are configured to rotate the substrate during processing to improve the film uniformity using a compact target, which reduces the cost of the target compared to large-area targets described above. Embodiments of the disclosure provided herein can provide a target that is tilted in relation to the substrate being processed in order to improve film uniformity. Embodiments of the disclosure provided herein can also enable co-sputtering by use of two or more cathodes simultaneously, which can increase throughput versus the use of a single cathode, and allow the composition of the deposited film to be adjusted. Embodiments of the disclosure provided herein can also enable oscillation of the magnetron in two approximately perpendicular directions to extend the magnetic field across the sputtering service area of the target for full face erosion. In general, oscillation helps the management of defects such as particles and arcing, and extends the life of the target compared to a fixed magnet where only certain areas of the target are eroded. Embodiments of the disclosure provided herein can also enable scanning of the magnetron along one or more paths across the backside surface of the target so that the uniformity of the deposited film can be controlled. For example, the scanning of the magnetron may be adjusted during the deposition process to compensate for any film thickness variation across different areas of the substrate.

Exemplary Substrate Processing System

FIG. 1 is a schematic top view of an exemplary substrate processing system 100 (also referred to as a "processing platform"), according to certain embodiments. In certain embodiments, the substrate processing system 100 is particularly configured for processing large-area substrates, such as panels as described above. The substrate processing system 100 generally includes an equipment front-end module (EFEM) 102 for loading substrates into the processing system 100, a first load lock chamber 104 coupled to the EFEM 102, a transfer chamber 106 coupled to the first load lock chamber 104, and a plurality of other chambers coupled to the transfer chamber 106 as described in detail below. The front-end module (EFEM) 102 generally includes one or more robots 105 that are configured to transfer substrates from the FOUPs 103 to at least one of the first load lock chamber 104 or the second load lock chamber 120. Proceeding counterclockwise around the transfer chamber 106 from the first load lock chamber 104, the processing system 100 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. In certain embodiments, the transfer chamber 106 and each chamber coupled to the transfer chamber 106 are maintained at a vacuum state. As used herein, the term "vacuum" may refer to pressures less than 760 Torr, and will typically be maintained at pressures near $10^{-5}$ Torr (i.e., ~$10^{-3}$ Pa). However, some high-vacuum systems may operate below near $10^{-7}$ Torr (i.e., ~$10^{-5}$ Pa). In certain embodiments, the vacuum is created using a rough pump and/or a turbomolecular pump coupled to the transfer chamber 106 and to each of the one or more process chambers (e.g., process chambers 108-118). However, other types of vacuum pumps are also contemplated.

In certain embodiments, substrates are loaded into the processing system 100 through a door (also referred to as an "access port"), in the first load lock chamber 104 and unloaded from the processing system 100 through a door in the second load lock chamber 120. In certain embodiments, a stack of substrates is supported in a cassette disposed in the FOUP, and are transferred therefrom by a robot 105 to the first load lock chamber 104. Once vacuum is pulled in the first load lock chamber 104, one substrate at a time is retrieved from the load lock chamber 104 using a robot 107 located in the transfer chamber 106. In certain embodiments, a cassette is disposed within the first load lock chamber 104 and/or the second lock chamber 120 to allow multiple substrates to be stacked and retained therein before being received by the robot 107 in the transfer chamber 106 or robot 105 in the EFEM 102. However, other loading and unloading configurations are also contemplated.

Pre-cleaning of the substrates is important to remove impurities, such as oxides, from the substrate surface, so that films (e.g., metal films) deposited in the deposition chambers are not electrically insulated from the electrically-conductive metal surface area of the substrate by the layer of impurities. By performing pre-cleaning in the first and second pre-clean chambers 110, 114, which share the vacuum environment similar to the first and second deposition chambers 112, 116, the substrates can be transferred from the cleaning chambers to the deposition chambers without being exposed to atmosphere. This prevents formation of impurities on the substrates during the transfer. In addition, vacuum pump-down cycles are reduced since a vacuum is maintained in the substrate processing system 100 during transfer of the cleaned substrates to the deposition chambers. In some embodiments, when a cassette is empty or full in the first load lock chamber 104 or the second load lock chamber 120 the processing system 100 may cause either of the load lock chambers to break vacuum so that one or more substrate can be added or removed therefrom.

In certain embodiments, only one substrate is processed within each pre-clean and deposition chamber at a time. Alternatively, multiple substrates may be processed at one time, such as four to six substrates. In such embodiments, the substrates may be disposed on a rotatable pallet within the respective chambers. In certain embodiments, the first and second pre-clean chambers 110, 114 are inductively coupled plasma (ICP) chambers for etching the substrate surface. However, other types of pre-clean chambers are also contemplated. In certain embodiments, one or both of the pre-clean chambers are replaced with a film deposition chamber that is configured to perform a PVD, chemical vapor deposition (CVD), or atomic layer deposition (ALD) process, such as deposition of silicon nitride.

In a pre-clean chamber that includes an ICP source, a coil at the top of the chamber is energized with an external RF source to create an excitation field in the chamber. A pre-clean gas (e.g., argon, helium) flows through the chamber from an external gas source. The pre-clean gas atoms in the chamber are ionized (charged) by the delivered RF energy. In some embodiments, the substrate is biased by a RF biasing source. The charged atoms are attracted to the substrate resulting in the bombardment and/or etching of the substrate surface. Other gases besides argon may be used depending on the desired etch rate and the materials to be etched.

In certain embodiments, the first and second deposition chambers 112, 116 are PVD chambers. In such embodiments, the PVD chambers may be configured to deposit copper, titanium, aluminum, gold, and/or tantalum. However, other types of deposition processes and materials are also contemplated.

Exemplary PVD Chamber and Method of Use

Figure 2A:
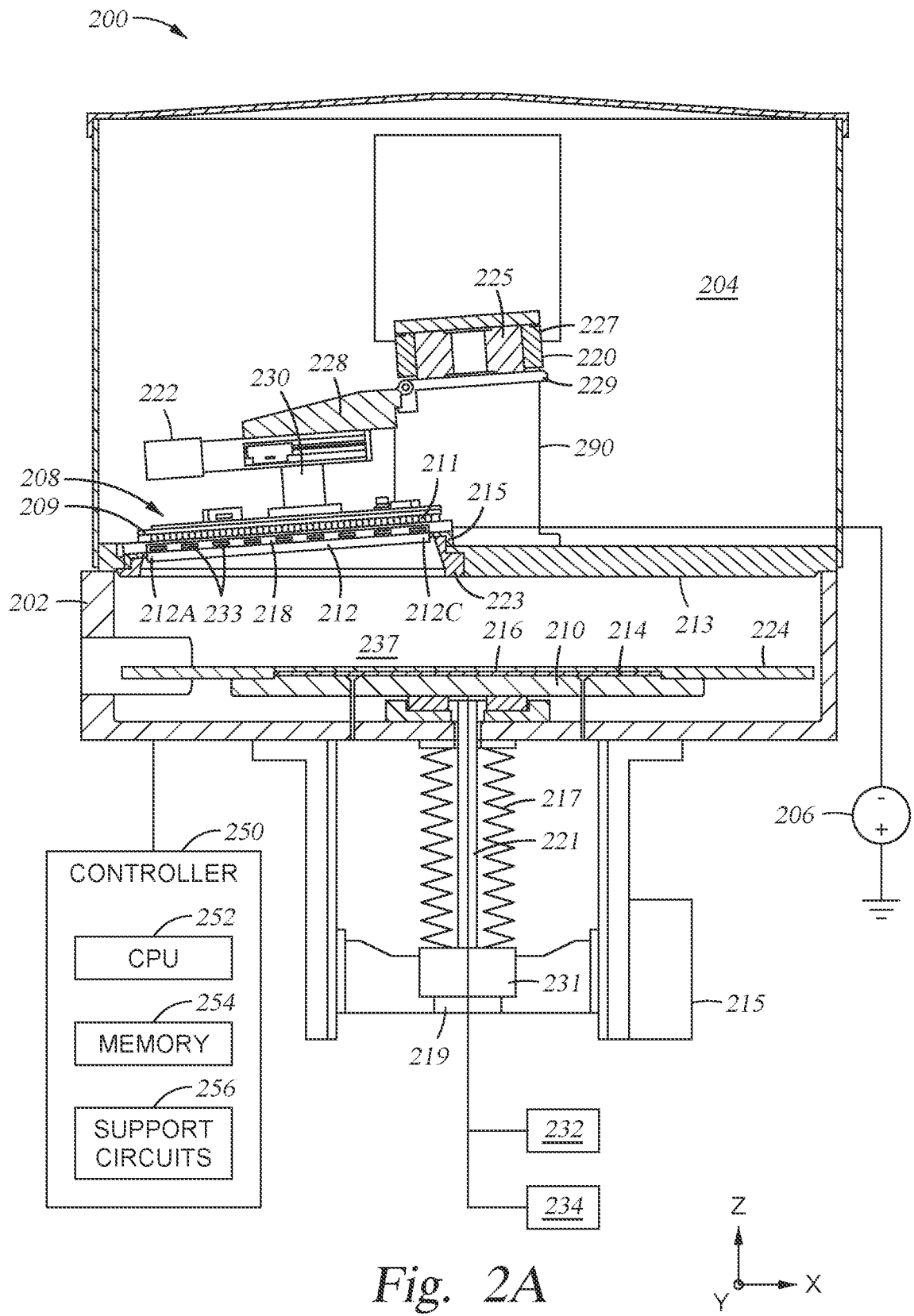
FIG. 2A is a side cross-sectional view of a PVD chamber that may be used in the substrate processing system of FIG. 1, according to certain embodiments.
Figure 2B:
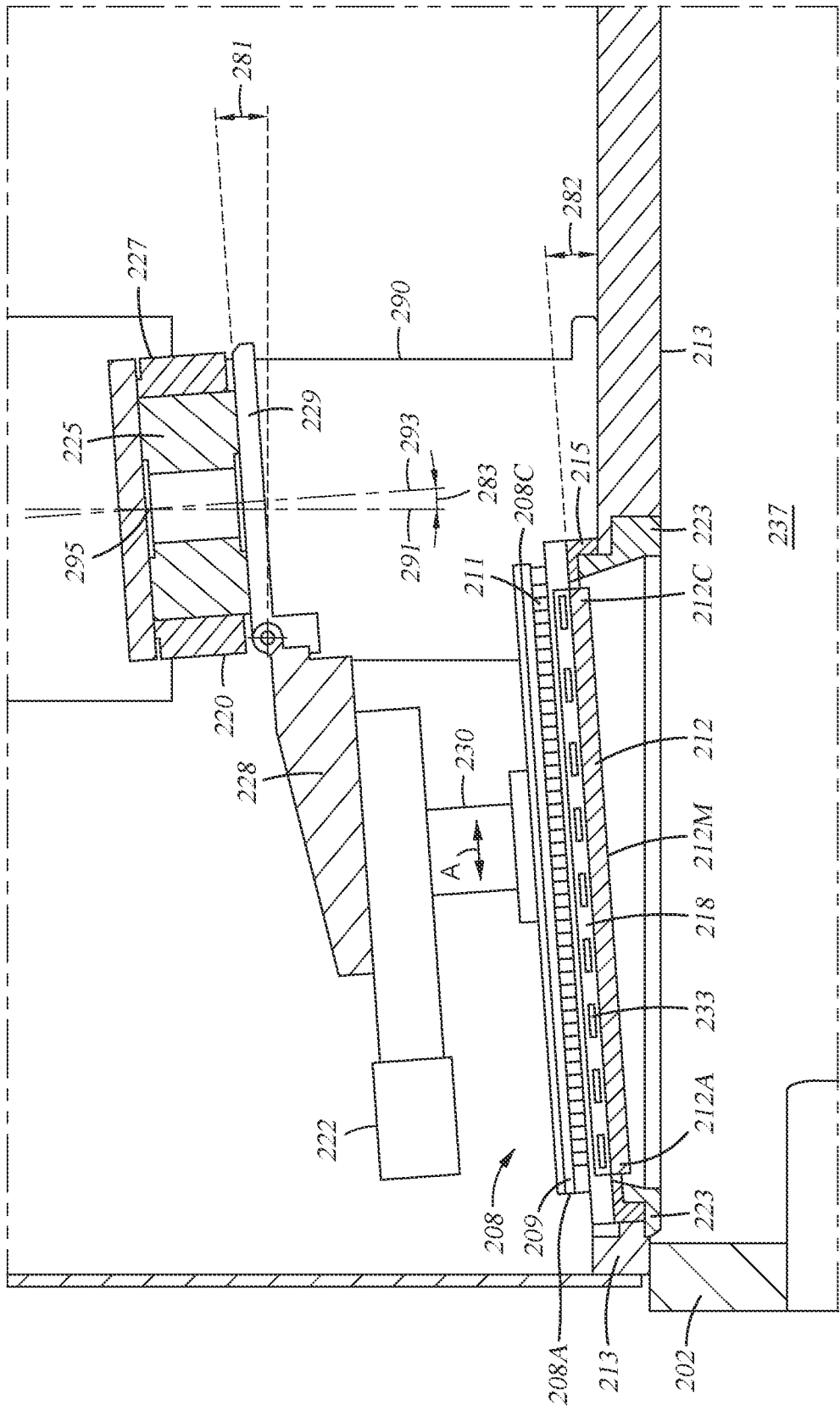
FIG. 2B is an enlarged cross-sectional view of a portion of the PVD chamber of FIG. 2A, according to certain embodiments.

FIG. 2A is a side cross-sectional view of a PVD chamber 200 that may be used in the substrate processing system 100 of FIG. 1, according to certain embodiments. For example, the PVD chamber 200 may represent either one of the first or second deposition chambers 112, 116 shown in FIG. 1. Alternatively, the PVD chamber 200 may represent an additional deposition chamber. FIG. 2B is an enlarged cross-sectional view of a portion of the PVD chamber 200 of FIG. 2A, according to certain embodiments. FIGS. 2A-2B are, therefore, described together herein for clarity.

The PVD chamber 200 generally includes a chamber body 202, a lid assembly 204 coupled to the chamber body 202, a magnetron 208 coupled to the lid assembly 204, a pedestal 210 disposed within the chamber body 202, and a target 212 disposed between the magnetron 208 and the pedestal 210. During processing, the interior of the PVD chamber 200, or processing region 237, is maintained at a vacuum pressure. The processing region 237 is generally defined by the chamber body 202 and the lid assembly 204, such that the processing region 237 is primarily disposed between the target 212 and the substrate supporting surface of the pedestal 210.

A power source 206 is electrically connected to the target 212 to apply a negatively biased voltage to the target 212. In certain embodiments, the power source 206 is either a straight DC mode source or a pulsed DC mode source. However, other types of power sources are also contemplated, such as radio frequency (RF) sources.

Figure 2C:
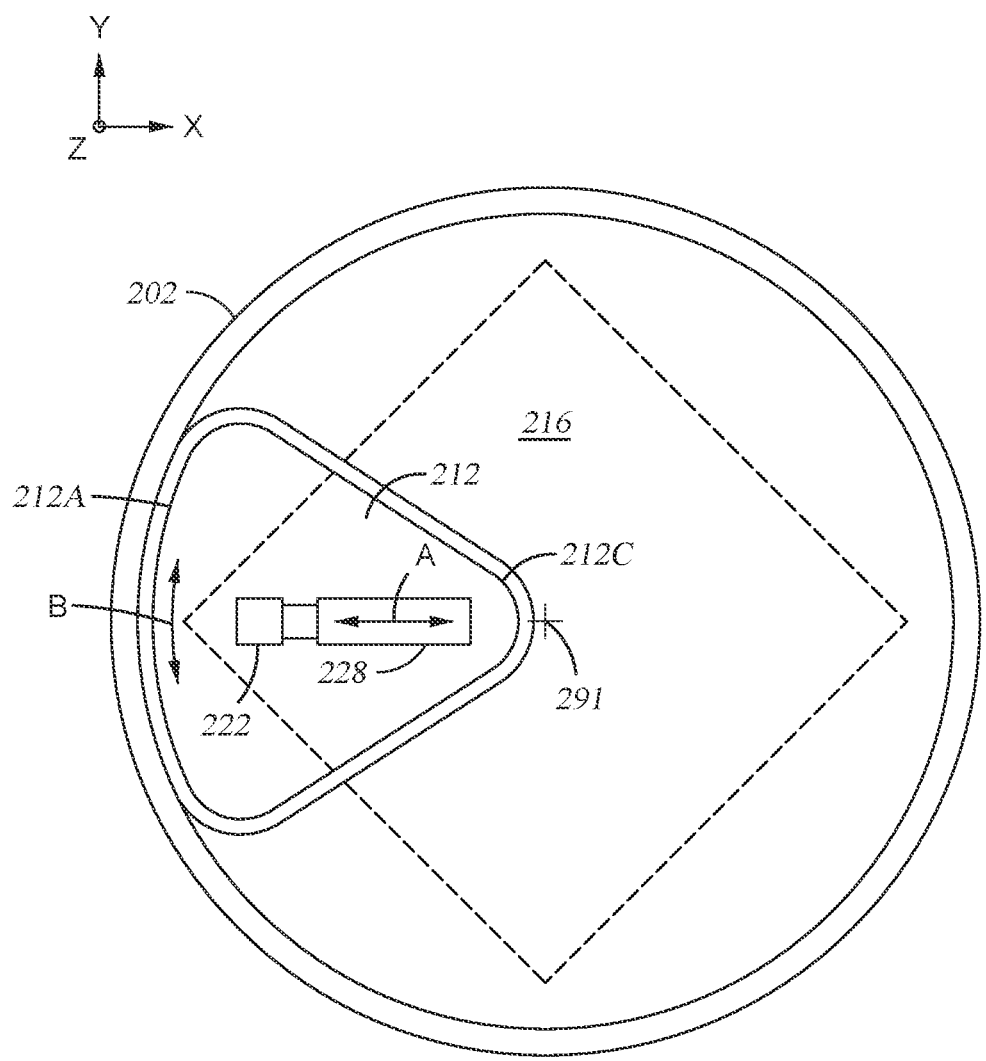
FIG. 2C is a top view of a portion of FIG. 2A illustrating an overlay of a target and a substrate, according to certain embodiments.

The target 212 includes a target material 212M and a backing plate 218, and is part of the lid assembly 204. A front surface of the target material 212M of the target 212 defines a portion of the processing region 237. The backing plate 218 is disposed between the magnetron 208 and target material 212M (FIG. 2B) of the target 212, wherein, in some embodiments, the target material 212M is bonded to the backing plate 218. Typically, the backing plate 218 is an integral part of the target 212 and thus for simplicity of discussion the pair may be referred to collectively as the "target." The backing plate 218 is electrically insulated from the support plate 213 of the lid assembly 204 by use of an electrical insulator 215 to prevent an electrical short being created between the backing plate 218 and the support plate 213 of the grounded lid assembly 204. As shown in FIG. 2A, the backing plate 218 has a plurality of cooling channels 233 configured to receive a coolant (e.g., DI water) therethrough to cool or control the temperature of the target 212. In certain embodiments, the backing plate 218 may have one or more cooling channels. In some examples, the plurality of cooling channels 233 may be interconnected and/or form a serpentine path through the body of the backing plate 218. A shield 223 is coupled to the support plate 213. The shield 223 prevents material sputtered from the target 212 from depositing a film on the support plate 213. In some embodiments, the magnetron 208 and target 212, which includes the target material 212M and backing plate 218, each have a triangular or delta shape, such that a lateral edge of the target 212 includes three corners (e.g., three rounded corners shown in FIGS. 2C-2D). As illustrated in FIG. 2C, the target 212 is oriented such that a tip of a corner of the triangular or delta shaped target is at or adjacent to the center axis 291. When viewed in a planar orientation view, as shown in FIG. 2C, the surface area of the target 212 is less than the surface area of the substrate 216. In some embodiments, a surface area of the upper surface of the pedestal is greater than a surface area of the front surface of the target 212. In some embodiments, the ratio of the surface areas of the front surface of the target 212 to the deposition surface of the substrate 216 (e.g., upper surface of the substrate) is between about 0.1 and about 0.4.

As shown in FIG. 2A, the magnetron 208 is disposed over a portion of the target 212, and in a region of the lid assembly 204 that is maintained at atmospheric pressure. The magnetron 208 includes a magnet plate 209 (or yoke) and a plurality of permanent magnets 211 attached to the shunt plate. The magnet plate 209 has a triangular or delta shape with three corners (FIG. 2C). The magnets 211 are arranged in one or more closed loops. Each of the one or more closed loops will include magnets that are positioned and oriented relative to their pole (i.e., north (N) and south (S) poles) so that a magnetic field spans from one loop to the next or between different portions of a loop. The sizes, shapes, magnetic field strength and distribution of the individual magnets 211 are generally selected to create a desirable erosion pattern across the surface of the target 212 when used in combination with oscillation of the magnetron 208 as described below. In certain embodiments, the magnetron 208 may include a plurality of electromagnets in place of the permanent magnets 211.

The pedestal 210 has an upper surface 214 supporting a substrate 216. A clamp 224 is used to hold the substrate 216 on the upper surface 214. In certain embodiments, the clamp 224 operates mechanically. For example, the weight of the clamp 224 may hold the substrate 216 in place. In certain embodiments, the clamp 224 is lifted by pins that are movable relative to the pedestal 210 to contact an underside of the clamp 224.

In this example, the backside of the substrate 216 is in contact with the upper surface 214 of the pedestal 210. In some examples, the entire backside of the substrate 216 may be in electrical and thermal contact with the upper surface 214 of the pedestal 210. The temperature of the substrate 216 may be controlled using a temperature control system 232. In certain embodiments, the temperature control system 232 has an external cooling source that supplies coolant to the pedestal 210. In some embodiments, the external cooling source is configured to deliver a cryogenically cooled fluid (e.g., Galden®) to heat exchanging elements (e.g., coolant flow paths) within a substrate supporting portion of the pedestal 210 that is adjacent to the upper surface 214, in order to control the temperature of the substrate to a temperature that is less than 20° C., such as less than 0° C., such as about −20° C. or less. In certain embodiments, the temperature control system 232 includes a heat exchanger and/or backside gas flow within the pedestal 210. In some examples, the cooling source may be replaced or augmented with a heating source to increase the workpiece temperature independent of the heat generated during the sputtering process. Controlling the temperature of the substrate 216 is important during the sputtering process to obtain a predictable and reliable thin film. In certain embodiments, a RF bias source 234 is electrically coupled to the pedestal 210 to bias the substrate 216 during the sputtering process. Alternatively, the pedestal 210 may be grounded, floated, or biased with only a DC voltage source. Biasing the substrate 216 can improve film density, adhesion, and material reactivity on the substrate surface.

A pedestal shaft 221 is coupled to an underside of the pedestal 210. A rotary union 219 is coupled to a lower end of the pedestal shaft 221 to provide rotary fluid coupling with the temperature control system 232 and rotary electrical coupling with the RF bias source 234. In certain embodiments, a copper tube is disposed through the pedestal shaft 221 to couple both fluids and electricity to the pedestal 210. The rotary union 219 includes a magnetic liquid rotary sealing mechanism (also referred to as a "Ferrofluidic® seal") for vacuum rotary feedthrough.

In this example, the substrate 216 is a panel. In certain embodiments, the upper surface 214 of the pedestal 210 fits a single square or rectangular panel substrate having sides of about 500 mm or greater, such as 510 mm by 515 mm or 600 mm by 600 mm. However, apparatus and methods of the present disclosure may be implemented with many different types and sizes of substrates.

In certain embodiments, the pedestal 210 is rotatable about an axis 291 perpendicular to at least a portion of the upper surface 214 of the pedestal 210. In this example, the pedestal 210 is rotatable about a vertical axis, which corresponds to the z-axis. In certain embodiments, rotation of the pedestal 210 is continuous without indexing. In other words, a motor 231 driving rotation of the pedestal 210 does not have programmed stops for rotating the substrate 210 to certain fixed rotational positions. Instead, the pedestal 210 is rotated continuously in relation to the target 212 to improve film uniformity. In certain embodiments, the motor 231 is an electric servo motor. The motor 231 may be raised and lowered by a separate motor 215. The motor 215 may be an electrically powered linear actuator. A bellows 217 surrounds the pedestal shaft and forms a seal between the chamber body 202 and the motor 231 during raising and lowering of the pedestal 210.

An underside surface of the target 212, which is defined by a surface of a target material 212M, faces towards the upper surface 214 of the pedestal 210 and towards a front side of the substrate 216. The underside surface of the target 212 faces away from the backing plate 218, which faces towards the atmospheric region or external region of the PVD chamber. In certain embodiments, the target materials 212M of the target 212 is formed from a metal for sputtering a corresponding film composition on the substrate 216. In one example, the target materials 212M may include a pure material or alloy containing elements selected from the group of copper (Cu), molybdenum (Mo), nickel (Ni), titanium (Ti), tantalum (Ta), aluminum (Al), cobalt (Co), gold (Au), silver (Ag), manganese (Mn), and silicon (Si). The materials deposited on a substrate 216 by the methods described herein may include pure metals, doped metals, metal alloys, metal nitrides, metal oxides, metal carbides containing these elements, as well as silicon containing oxides, nitrides or carbides.

In the illustrated embodiments, a plane that is parallel to the underside of the target 212 is tilted in relation to an upper surface of the support plate 213 by an angle 282 as shown in FIG. 2B. In other words, the plane of the target 212 is tilted in relation to a plane of the upper surface 214 of the pedestal 210 and, thus, in relation to the front side of the substrate 216. Because respective bodies of each of the pedestal 210 and the target 212 are generally planar, the target 212 may also be referred to as being tilted relative to the pedestal 210, and vice versa. In certain embodiments, the angle 282 is about 2° to about 10°, such as about 3° to about 5°. As shown in FIG. 2A, the angle 282 is about 4°. As shown in FIG. 2A, the target 212 is tilted downward in a direction from an inner radial edge 212C of the target 212 to an outer radial edge 212A of the target 212. The inner radial edge 212C is farther from the upper surface 214 of the pedestal 210 (e.g., vertically) compared to the outer radial edge 212A. In one example, a target 212 includes an edge that includes three corners, and one of the three corners, which is coincident with the inner radial edge 212C, is positioned farther from the upper surface of the pedestal 210 as compared to each of the two other corners due to the formed tilt angle. It is believed that tilt angles above the range provided herein may have target-to-substrate spacing that varies too much from the inner radial edge 212C to the outer radial edge 212A, which can result in undesirable variation in film quality. In one example, an undesirable variation in film quality will include an undesirable variation in film roughness or grain size, or substrate center-to-edge uniformity. In another example, the undesirable variation in film quality can include an undesirable ratio of the amount of sputtered material provided to the surface of the substrate versus the amount of sputtered material provided to the shields that surround the substrate during a PVD process. Tilt angles below the range provided herein cause undesirable non-uniformity of the film. Therefore, the tilt angle window provided herein is able to achieve film deposition results that are improved over other conventional designs.

In this example, the pedestal 210 is substantially horizontal, or parallel to the x-y plane, whereas the target 212 is non-horizontal, or tilted in relation to the x-y plane. However, other non-horizontal orientations of the pedestal 210 are also contemplated.

A first actuator 220 is coupled to the lid assembly 204 and to the magnetron 208 for oscillating the magnetron 208 in a circumferential direction B (shown in FIG. 2C) centered about the rotational axis 293 of the first actuator 220 that is positioned near and at an angle 283 to the center axis 291. In some embodiments, the rotational axis 293 is perpendicular to the surface of the target 212. In some embodiments, as illustrated in FIG. 2B, the rotational axis 293 is disposed a distance from the magnetron 208 (e.g., nearest edge 208C of the magnetron 208) when measured relative to a plane that is perpendicular to the rotational axis 293. The first actuator 220 has a rotor 225 and a stator 227. The stator 227 is coupled to a support post 290 that is coupled to the support plate 213 of the lid assembly 204. The rotor 225 is coupled to a mounting plate 229 that is coupled to the magnetron 208 through a hinge 228 (described in detail below). In some configurations, the center axis 291 of the support post 290 is centered in relation to the chamber body 202 and the lid assembly 204. In certain embodiments, the first actuator 220 is an electric motor. Alternatively, a pneumatic motor may be used. In some examples, the first actuator 220 may be a servo or stepper motor. In some examples, the first actuator 220 may be a direct drive motor, a belt drive motor, or a gear drive motor. In certain embodiments, the first actuator 220 has program stops corresponding to the circumferential oscillation angle. In certain embodiments, the first actuator 220 is an electric or pneumatic rotary actuator corresponding to the circumferential oscillation angle. However, other types of motors/actuators are also contemplated.

In the illustrated embodiments, a hinge 228 is used to couple a support body 230 of the magnetron 208 to the first actuator 220. The hinge 228 enables the magnetron 208 to be lifted and rotated out of the way of the backing plate 218. This provides easy access to the underside of the magnetron 208 and the topside of the backing plate 218 for performing maintenance, such as replacing the target 212.

As noted above, in some embodiments, the first actuator 220 is tilted in relation to the lid assembly 204. As shown in FIG. 2B, a rotational axis 293 of the first actuator 220 is tilted in relation to the center axis 291 of the support post 290 by an angle 283. The center axis 291 and rotational axis 293 intersect at a pivot point 295. In this example, a rotational axis 293 of the first actuator 220 is perpendicular to the mounting plate 229, which is tilted in relation to the upper surface of the support plate 213 by an angle 281. It will be appreciated that the angles 281, 283 are equal, such that the distance between the lower surface of the magnetron 208 and the upper surface of the backing plate 218 remain constant as the magnetron 208 is translated across over the surface of the backing plate 218 by use of the first actuator 220 and second actuator 222 during processing. In this example, the first actuator 220 is parallel to the backing plate 218 of the target 212 such that the angle 282 of the target 212 is equal to the angle 281 of the first actuator 220. In some other examples, the first actuator 220 may be oriented vertically (FIG. 3A), such as parallel to or collinear with the center axis 291, instead of tilted (shown in FIGS. 2A-2B).

Referring back to FIGS. 2A-2B, a second actuator 222 is coupled between the magnetron 208 and the first actuator 220 to allow the magnetron 208 to be oscillated in a radial direction "A" (FIG. 2C) in relation to the target 212 and PVD chamber 200. The second actuator 222 is an electric linear actuator having a stroke distance corresponding to the desired radial oscillation distance. Alternatively, a pneumatic linear actuator may be used. In certain embodiments, the second actuator 222 is an electric or pneumatic rotary motor with program stops corresponding to the radial oscillation distance. In some examples, the second actuator 222 may be a direct drive motor, a belt drive motor, or a gear drive motor that is coupled to lead-screw assembly, which can include a slide, that is used to guide the motion of the magnetron 208 in the desired radial direction. However, other types of motors/actuators are also contemplated.

The translation of the magnetron 208 over the surface of the backing plate 218 is used to achieve full-face erosion of the underside of the target 212, and helps with defect management. In addition, this helps extend the life of the target 212 compared to a fixed magnet where only certain areas of the target 212 are eroded. In certain embodiments, the first and second actuators 220, 222 are synchronized to control the scanning path of the magnetron 208 in one or more directions across the backside of the backing plate 218 as described in more detail below in relation to FIG. 2D.

A system controller 250, such as a programmable computer, is coupled to the PVD chamber 200 for controlling the PVD chamber 200 or components thereof. For example, the system controller 250 may control the operation of the PVD chamber 200 using direct control of the power source 206, the magnetron 208, the pedestal 210, cooling of the backing plate 218, the first actuator 220, the second actuator 222, the temperature control system 232, and/or the RF bias source 234, or using indirect control of other controllers associated therewith. In operation, the system controller 250 enables data acquisition and feedback from the respective components to coordinate processing in the PVD chamber 200.

The system controller 250 includes a programmable central processing unit (CPU) 252, which is operable with a memory 254 (e.g., non-volatile memory) and support circuits 256. The support circuits 256 (e.g., cache, clock circuits, input/output subsystems, power supplies, etc., and combinations thereof) are conventionally coupled to the CPU 252 and coupled to the various components of the PVD chamber 200.

In some embodiments, the CPU 252 is one of any form of general purpose computer processor used in an industrial setting, such as a programmable logic controller (PLC), for controlling various monitoring system component and sub-processors. The memory 254, coupled to the CPU 252, is non-transitory and is typically one or more of readily available memory such as random access memory (RAM), read only memory (ROM), floppy disk drive, hard disk, or any other form of digital storage, local or remote.

Herein, the memory 254 is in the form of a computer-readable storage media containing instructions (e.g., non-volatile memory), that when executed by the CPU 252, facilitates the operation of the PVD chamber 200. The instructions in the memory 254 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

In operation, the PVD chamber 200 is evacuated and back filled with argon gas. The power source 206 applies a negative bias voltage to the target 212 to generate an electric field inside the chamber body 202. The electric field acts to attract gas ions, which due to their collision with the exposed surface of the target 212, generates electrons that enable a high-density plasma to be generated and sustained near the underside of the target 212. The plasma is concentrated near the surface of target material 212M due to the magnetic field produced by the magnetron 208. The magnetic field forms a closed-loop annular path acting as an electron trap that reshapes the trajectories of the secondary electrons ejected from the target material 212M into a cycloidal path, greatly increasing the probability of ionization of the sputtering gas within the confinement zone. The plasma confined near the underside of the target 212 contains argon atoms, positively charged argon ions, free electrons, and neutral atoms (i.e., unionized atoms) sputtered from the target material 212M. The argon ions in the plasma strike the target surface and eject atoms of the target material, which are accelerated towards the substrate 216 to deposit a thin film on the substrate surface.

Inert gases, such as argon, are usually employed as the sputtering gas because they tend not to react with the target material or combine with any process gases and because they produce higher sputtering and deposition rates due to their relatively high molecular weight.

FIG. 2C is a top view illustrating an overlay of the target 212 and the substrate 216 in relation to the chamber body 202 of FIG. 2A, according to certain embodiments. In certain embodiments, the outer radial edge 212A of the target 212 extends a distance of about 1 inch to about 3 inches, such as about 1.5 inches beyond a corner of the substrate 216. In certain embodiments, the inner radial edge 212C of the target 212 is spaced a distance of about 0.25 inches to about 0.75 inches, such as about 0.5 inches from the center axis 291 of the support post 290, which may be coincident with a radial center of the chamber body 202.

Figure 2D:
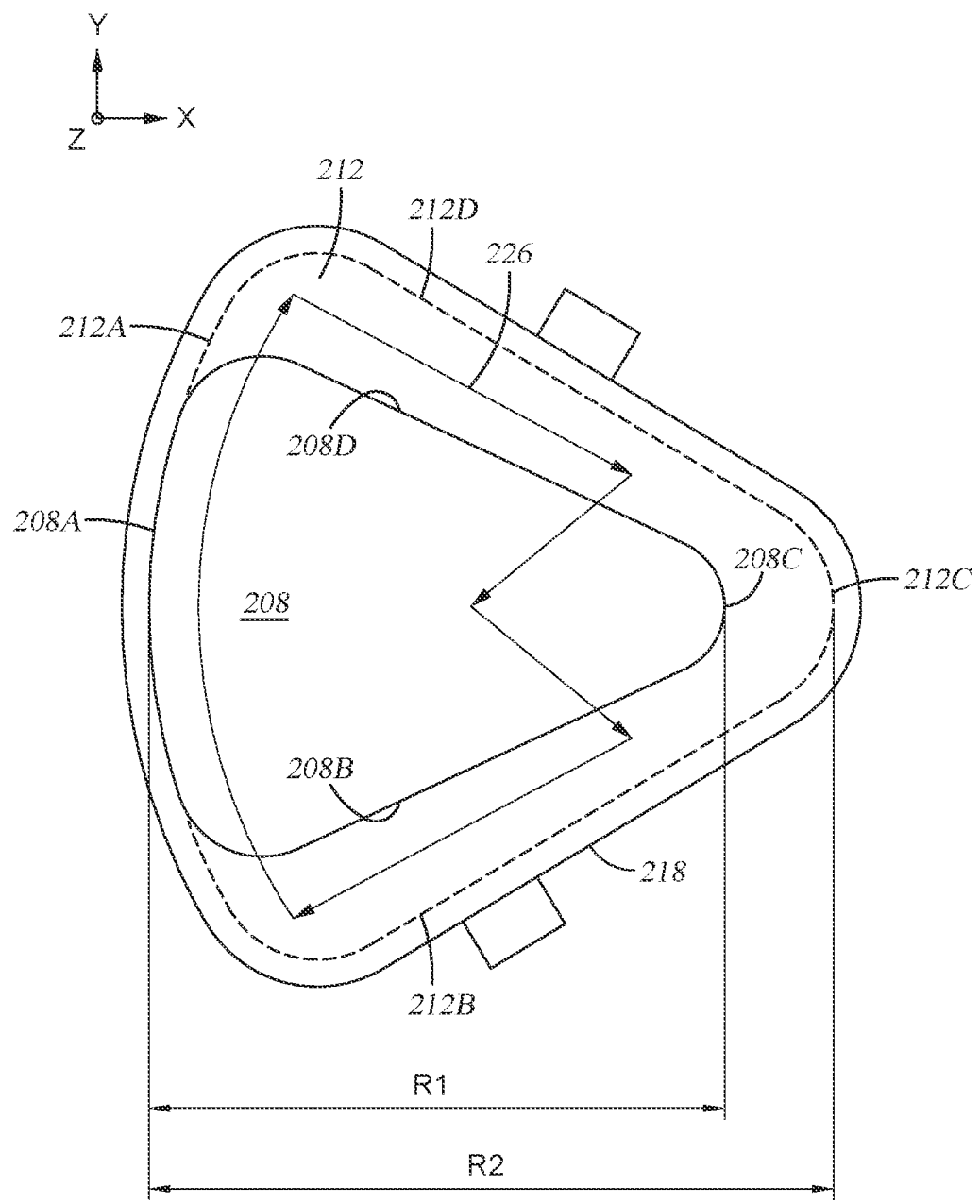
FIG. 2D is a top view of a portion of FIG. 2A illustrating an overlay of a magnetron and a target, according to certain embodiments.

FIG. 2D is a top view illustrating an overlay of the magnetron 208 and the target 212 of FIG. 2A, according to certain embodiments. Note that the structure surrounding the perimeter of the target 212 in FIG. 2D is part of the backing plate 218. As shown in FIGS. 2C-2D, the target material 212M, backing plate 218 and magnetron 208 each have a triangular or delta shape that has three rounded corners, wherein one of the three rounded corners is positioned near or substantially adjacent to the center axis 291. As illustrated in FIG. 2D, the target 212 and magnetron 208 are shaped and oriented such that the magnetron 208 is able to be translated over substantially the entire active area of the target 212, such as the target material 212M portion of the target. In some embodiments, the target 212 and magnetron 208 have substantially the same shape as described in more detail below. As illustrated in FIG. 2D, a radius R1 of the magnetron 208 is less than a corresponding radius R2 of the target 212 so that the magnetron 208 is able to translate in the radial direction as described above. As shown in FIG. 2D, an outer radial edge 208A of the magnetron 208 has a radius of curvature that is less than or equal to the corresponding outer radial edge 212A of the target 212. In some embodiments, the radii of curvature differ by about 40% or less, such as about 20% or less. An arc length of the outer radial edge 208A of the magnetron 208 is less than a corresponding arc length of the outer radial edge 212A of the target 212 so that the magnetron 208 is able to translate in the circumferential direction as described above. As shown in FIG. 2D, respective opposite edges 208B and 208D of the magnetron 208 and corresponding opposite edges 212B and 212D of the target 212 are oriented close to parallel, respectively, to each other. In some embodiments, angles between the respective edges 208B, 212B and 208D, 212D are within a range of about 5° or less, such as about 0° to about 5°, such as about 0° (i.e., parallel to each other).

As shown in FIG. 2D, the first and second actuators 220, 222 can be synchronized to scan the magnetron 208 along a scan path 226. The first and second actuators 220, 222 may be synchronized (e.g., by the system controller 250) to control the translation of the magnetron 208 so that the magnetron 208 follows the scan path 226. Note that the scan path 226 is illustrated as proceeding one step at a time in a clockwise direction for illustrative purposes only. However, the scan path 226 can include one or more back-and-forth motions along any portion of the scan path 226 (i.e., scan path segment) in any desired direction without deviating from the basic scope of the disclosure provided herein. In some embodiments, the scan path 226 includes a process of translating the magnetron 208 in at least one of the radial and circumferential directions as described above, and thus includes a scan path 226 that is often referred to herein as a loop shaped path, as, for example, the scan path shown in FIG. 2D. In some embodiments, the translational motion of the magnetron 208 does not include a rotational motion of the magnetron 208, such as a rotating or twisting motion of the magnetron 208 about a rotational axis that is positioned within the extents of the magnetron 208 during processing, which is common in conventional circular target containing PVD chamber designs. The scan path 226 includes a circumferential component B (shown in FIG. 2C) that is arc shaped and generally primarily aligned with the direction of the y-axis in FIG. 2C due to the circumferential motion provided by the actuation of the first actuator 220. In addition, the scan path 226 includes a radial component "A" (shown in FIG. 2C), which is shown in FIG. 2C as being aligned in the direction of the x-axis due to the alignment of the second actuator 222 with the x-axis at an instant in time during the completion of the scan path 226. In the example shown in FIG. 2D, the scan path 226 forms a complex loop shaped scan path 226 that is illustrated as a series of scan path segments, which are illustrated by the series of linked arrows. In some embodiments, the scan path 226 includes two segments (e.g., one back-and-forth motion), but the scan path 226 will typically include more than two segments, which are used to assure that the translation of the magnetron 208 across the target 212 causes removal of target material 212M from all areas of the target face during processing to reduce particle generation and improve target material utilization. The scan path 226 may be precisely controlled and conformed to a variety of different shaped segments based on the oscillation frequency and stroke length of the respective motors. In certain examples, the scanning of the magnetron 208 may be controlled to increase the total eroded area of the underside of the target 212. In certain examples, the scanning of the magnetron 208 may be programmed to control uniformity of the film deposited on the substrate surface. In certain examples, the scan path of the magnetron 208 may be adjusted to compensate for any variations in thickness of the deposited film on the substrate surface.

In certain embodiments, in addition to being synchronized together, the first and second actuators 220, 222 are also synchronized with rotation of the pedestal 210 to further control uniformity of the film deposited on the substrate surface.

Alternative PVD Chamber and Method of Use

Figure 3A:
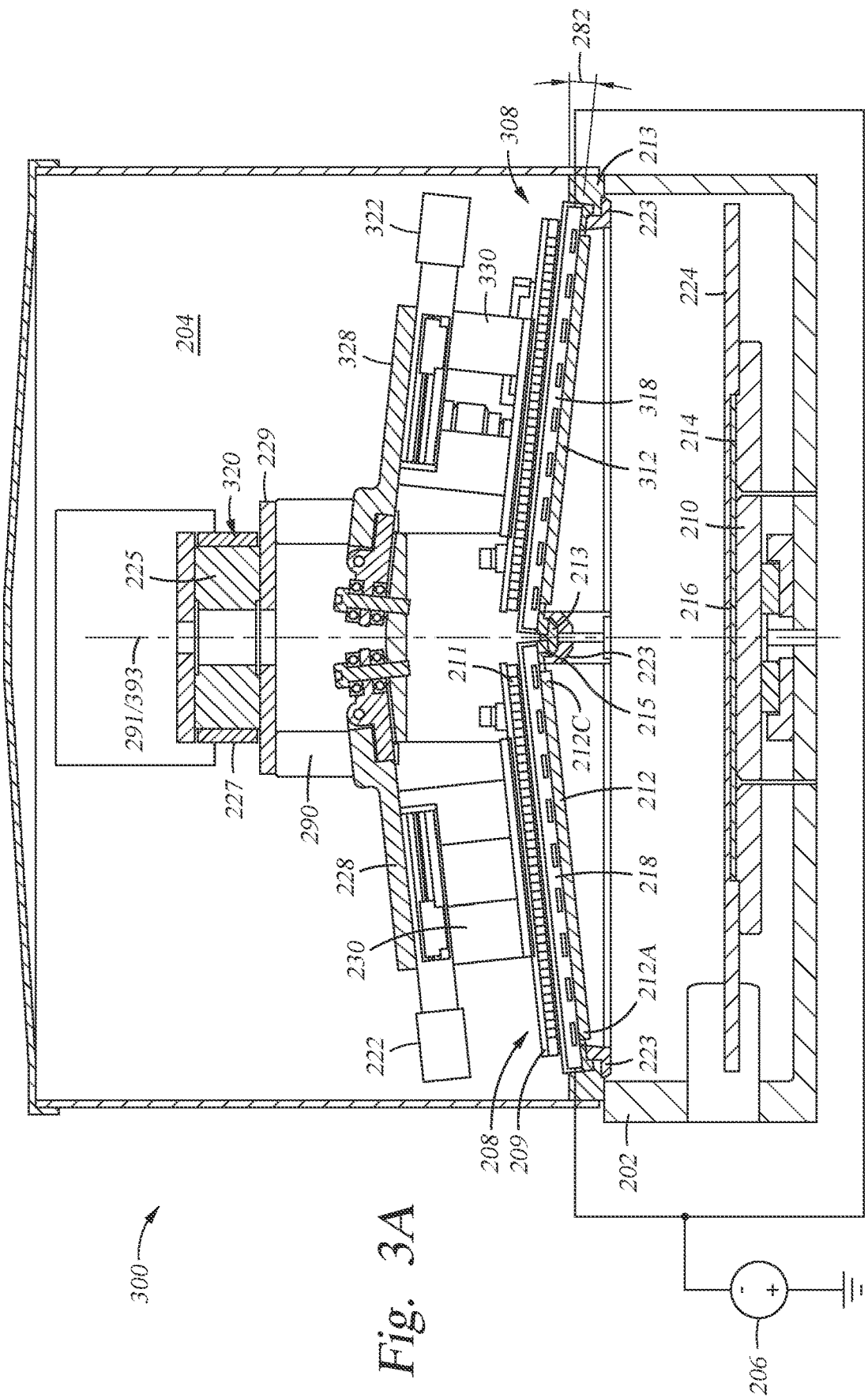
FIG. 3A is a side cross-sectional view of another PVD chamber that may be used in the substrate processing system of FIG. 1, according to certain embodiments.
Figure 3B:
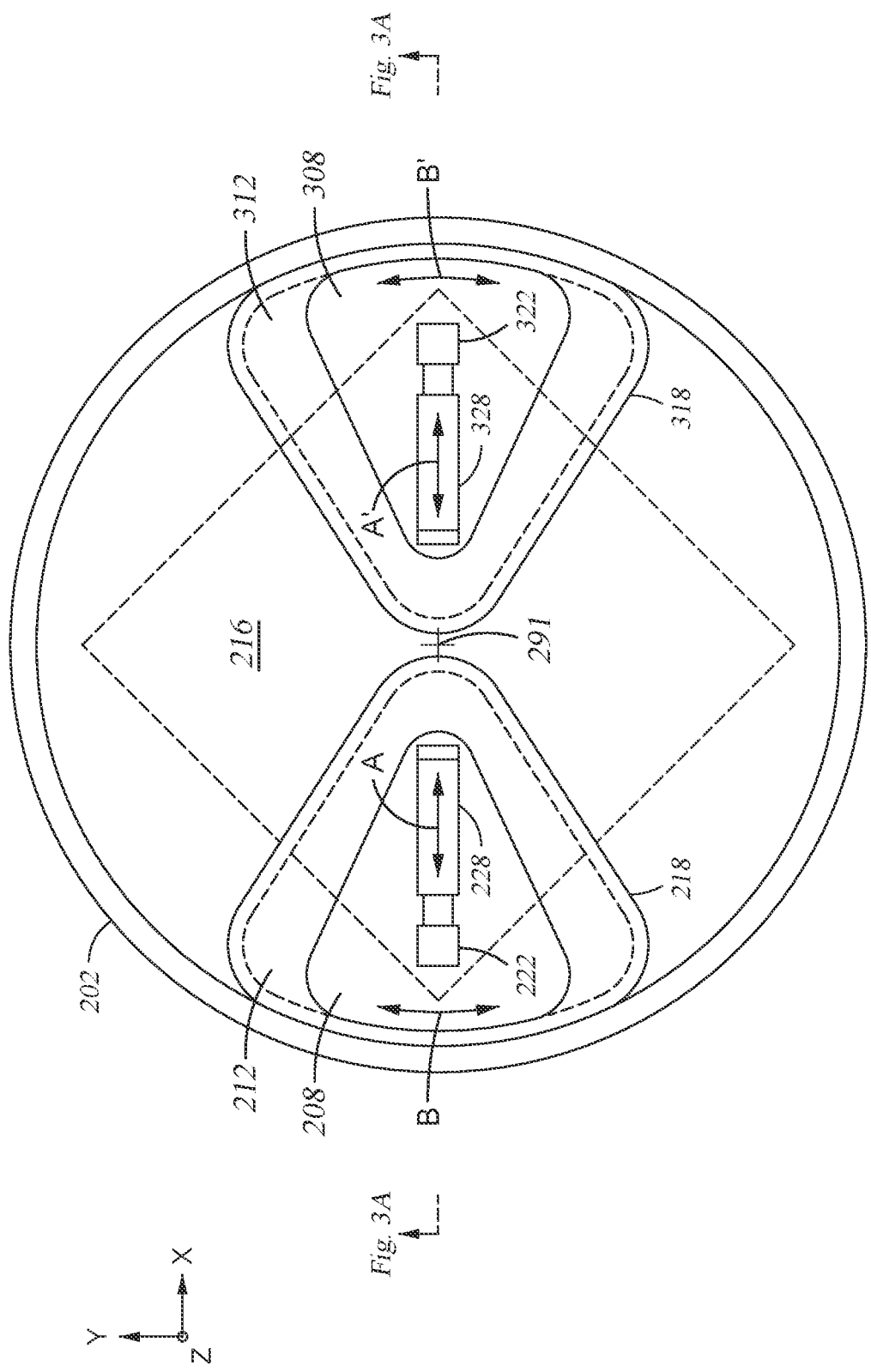
FIG. 3B is a schematic top view of the PVD chamber of FIG. 3A, according to certain embodiments.

FIG. 3A is a cross-sectional view of a PVD chamber 300 that was formed by the application of the sectioning line applied to the top view of the PVD chamber 300 shown in FIG. 3B. The PVD chamber 300 can be used in the substrate processing system 100 of FIG. 1, according to certain embodiments. For example, the PVD chamber 300 may represent either one of the first or second deposition chambers 112, 116 shown in FIG. 1. Alternatively, the PVD chamber 300 may represent an additional deposition chamber. FIG. 3B is a schematic top view of the PVD chamber 300 of FIG. 3A, according to certain embodiments. FIGS. 3A-3B are, therefore, described together herein for clarity.

The PVD chamber 300 enables co-sputtering from one or more different targets at the same time, in contrast to the PVD chamber 200 (shown in FIG. 2A) that is only capable of single-target sputtering. The PVD chamber 300 includes a second magnetron 308 coupled to the lid assembly 204 and a second target 312 disposed between the second magnetron 308 and the upper surface 214 of the pedestal 210. A hinge 328 is used to couple a support body 330 of the second magnetron 308 to a first actuator 320. The second target 312 is tilted similar to the first target 212 as described above. In certain embodiments, the first and second targets 212, 312 are formed from the same material. In certain embodiments, the first and second targets 212, 312 are formed from different materials. In certain embodiments, the first and second targets 212, 312 are able to provide the same sputtered material onto different areas of a substrate simultaneously. Although only one target is shown in FIG. 2A and two targets are shown in FIG. 3A, embodiments of the present disclosure are not particularly limited to the illustrated embodiments. In some other embodiments, the PVD chamber includes more than two targets. In such embodiments, the PVD chamber includes a magnetron that is positioned over a target, such that at least one magnetron is positioned over one target. In certain embodiments, each target is tilted in the radial direction towards the center axis 291, 393, which is similar to the first and second targets 212, 312 as described above.

In the PVD chamber 300, a first actuator 320 is coupled to the lid assembly 204 and to both magnetrons 208, 308 for oscillating both magnetrons 208, 308 in a circumferential direction "B", "B" about the center axis 291, 393, and in relation to the corresponding targets 212, 312. The magnetrons 208, 308 rotate in the same direction as the rotor 225 (e.g., clockwise or counterclockwise). As shown in FIG. 3A, the first actuator 320 is aligned with the lid assembly 204 and the magnetrons 208, 308 are each tilted in relation to the first actuator 320 by the angle 282 to align the magnetrons 208, 308 parallel to the backing plates 218, 318 of the corresponding targets 212, 312. In this example, a center axis 393 of the first actuator 320 is coincident with the center axis 291 of the support post 290. In some embodiments, this is in contrast to the PVD chamber 200 (shown in FIGS. 2A-2B) in which the first actuator 220 is tilted in relation to the lid assembly 204 by the angle 283.

In the PVD chamber 300, a second actuator 322 is coupled between the magnetron 308 and the first actuator 320 to allow the magnetron 308 to be oscillated in a radial direction "A" (FIG. 3B) in relation to the target 312 and PVD chamber 300. The second actuator 322 is actuated independently of the first actuator 320 similar to actuation of the second actuator 222 described above. In some embodiments, each magnetron 208, 308 is translated in at least one of the radial and circumferential directions as described above. A scan path of each magnetron 208, 308 includes a circumferential component "B", "B" that is arc shaped and generally primarily aligned with the direction of the y-axis in FIG. 3B due to the circumferential motion provided by the actuation of the first actuator 320. In addition, a scan path of each magnetron 208, 308 includes a radial component "A", "A" aligned in the direction of the x-axis from actuation of the corresponding second actuator 222, 322. The scan paths are precisely controlled so that the magnetron can be translated along one or more paths that can have a variety of different shapes based on the adjustment of the oscillation frequency and stroke length of the respective motors. The radial component "A" of magnetron 208 and the radial component "A" of magnetron 308 are controlled independently of each other. However, the circumferential component "B" of magnetron 208 and the circumferential component "B" of magnetron 308 are linked through being coupled to the first actuator 320 as described above.

Figure 4:
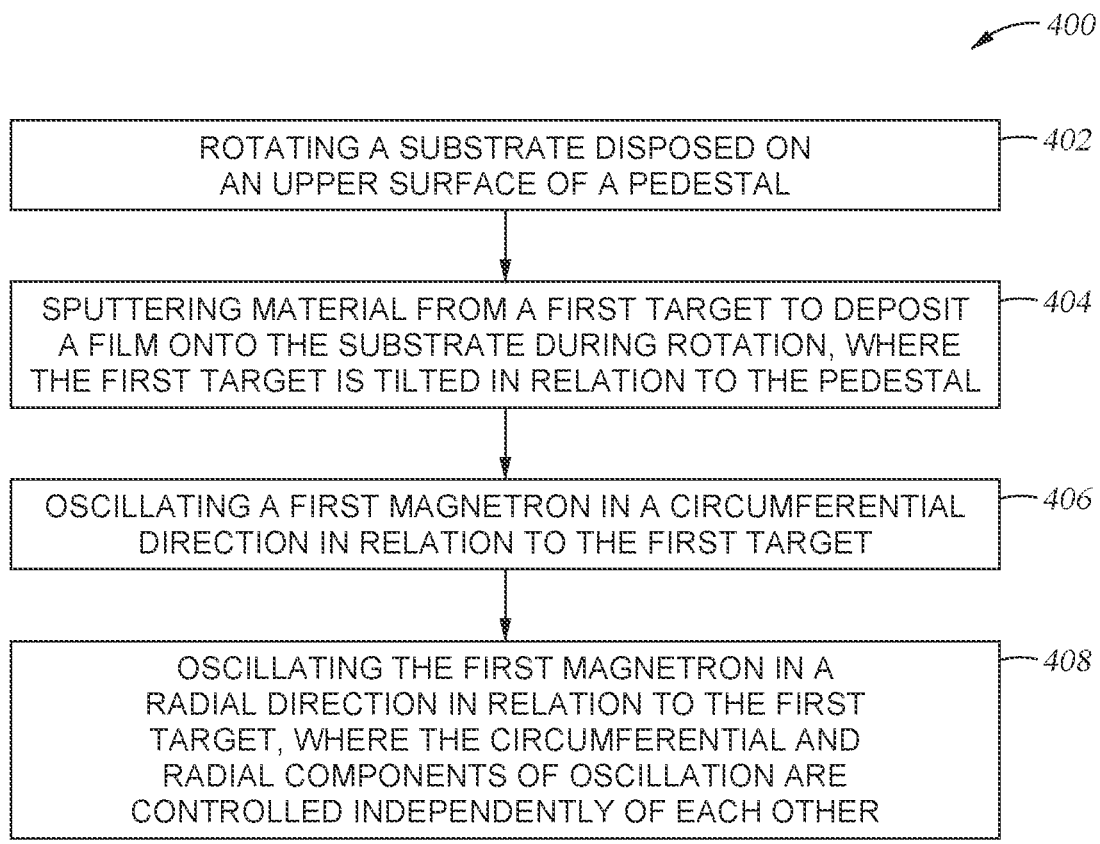
FIG. 4 is a diagram illustrating a method of processing a substrate using a PVD chamber, according to certain embodiments.

FIG. 4 is a diagram illustrating a method 400 of processing a substrate using a PVD chamber, according to certain embodiments. Note that PVD chamber 200 is described in the following example for illustrative purposes only. At operation 402, a substrate 216 disposed on an upper surface 214 of a pedestal 210 and is rotated about a rotational axis by use of the motor 231, and relative to one or more targets (e.g., target 212 or targets 212 and 312). In some embodiments, the pedestal 210 is rotated continuously in relation to the one or more targets to improve film uniformity.

At operation 404, material from a first target 212 is sputtered to deposit a film onto the substrate 216 during rotation. The first target 212 is tilted in relation to the pedestal 210 by the angle 282 (shown in FIG. 2B). When the PVD chamber 300 configuration is used, material from a second target 312 can also be sputtered onto the substrate 216 during the rotation of the substrate. Material from each of the first and second targets 212, 312 may be sputtered onto different areas of the substrate 216 simultaneously.

At operation 406, a first magnetron 208 is translated in a circumferential direction B in relation to the first target 212 by use of the first actuator 220, which is coupled to the magnetron 208 via the hinge 228 and support body 230. When the PVD chamber 300 configuration is used, first magnetron 208 and second magnetron 308 are both simultaneously translated in a circumferential direction B by use of the first actuator 320 that is coupled to first magnetron 208 and second magnetron 308 by the hinges 228, 328 and support bodies 230, 330, respectively.

At operation 408, the first magnetron 208 is translated in a radial direction A in relation to the first target 212 by use of the first actuator 220, which is coupled to the magnetron 208 via the support body 230. When the PVD chamber 300 configuration is used, first magnetron 208 and second magnetron 308 can both be simultaneously translated in the radial direction A by use of the system controller 250, the second actuator 222 that is coupled to first magnetron 208 via the support body 230, and the second actuator 322 that is coupled to second magnetron 308 via the support body 330. The circumferential direction B and radial direction A components of translation of one or more magnetrons can be controlled independently of each other by use of the system controller 250. In some embodiments of method 400, operations 406 and 408 are substantially performed simultaneously.

Additionally, in some embodiments of method 400, operations 402, 404, 406 and 408 are substantially performed simultaneously. In some embodiments of method 400, operations 402, 406 and 408 are initiated before operation 404 is initiated. In some embodiments of method 400, operations 402, 404, 406 and 408 are initiated in a sequential order. In some embodiments of method 400, operations 402, 404, 406 and 408 are initiated in a non-sequential order.

While the foregoing is directed to embodiments of the present disclosure, other and further embodiments of the disclosure may be devised without departing from the basic scope thereof, and the scope thereof is determined by the claims that follow.

What is claimed is:

1. A physical vapor deposition (PVD) chamber, comprising:
   a pedestal disposed within a processing region of the PVD chamber, the pedestal having an upper surface that is configured to support a substrate thereon;
   a first motor coupled to the pedestal, the first motor configured to rotate the pedestal about a first axis that is perpendicular to at least a portion of the upper surface of the pedestal;
   a lid assembly comprising a first target, wherein
      a surface of the first target defines a portion of the processing region, and comprises a first target material;
      a surface area of the upper surface of the pedestal is greater than a surface area of the surface of the first target; and
      the surface of the first target is tilted at a first angle in relation to a plane of the upper surface of the pedestal;
   a first magnetron disposed over a portion of the first target, and in a region of the lid assembly that is maintained at atmospheric pressure;
   a first actuator configured to oscillate the first magnetron in a circumferential direction centered about a second axis;
   a second actuator configured to oscillate the first magnetron in a radial direction;
   a hinge that is directly coupled to both the first actuator and the second actuator; and
   a system controller that is configured to cause the first magnetron to oscillate along at least a portion of a first path by causing the first actuator and the second actuator to simultaneously and independently oscillate the first magnetron.

2. The PVD chamber of claim 1, wherein the first magnetron and the first target are delta-shaped.

3. The PVD chamber of claim 1, further comprising a rotary union coupled to the pedestal, the rotary union configured to provide fluid coupling to the pedestal during rotation of the pedestal about the first axis.

4. The PVD chamber of claim 1, wherein the upper surface of the pedestal is configured to receive a square or rectangular substrate having sides that have a length of about 500 mm or greater.

5. The PVD chamber of claim 1, wherein an edge of the first target comprises three corners, and one of the three corners is radially positioned closer to the first axis than the two other corners.

6. The PVD chamber of claim 5, wherein the one of the three corners of the first target is farther from the upper surface of the pedestal compared to each of the two other corners.

7. The PVD chamber of claim 1, wherein
the first target further comprises a first backing plate having one or more cooling channels therein configured to receive a coolant therethrough for cooling the first target, and
the PVD chamber further comprises:
a second target, wherein
a surface of the second target defines a different portion of the processing region, and comprises a second target material;
the surface area of the upper surface of the pedestal is greater than a surface area of the surface of the second target;
the surface of the second target is tilted at a second angle in relation to the plane of the upper surface of the pedestal; and
the second target further comprises a second backing plate having one or more cooling channels therein configured to receive a coolant therethrough for cooling the second target; and
a second magnetron disposed over a portion of the second target, and in the region of the lid assembly that is maintained at atmospheric pressure.

8. The PVD chamber of claim 7, wherein the first and second target materials comprise the same material.

9. The PVD chamber of claim 7, wherein the first and second target materials comprise different materials.

10. The PVD chamber of claim 7, wherein the first and second targets are configured to deposit the same material onto different areas of a substrate simultaneously.

11. The PVD chamber of claim 1, wherein:
the second axis is tilted in relation to the first axis, and
the second axis extends in a direction that is perpendicular to the surface of the first target.

12. The PVD chamber of claim 1, wherein the system controller is configured to synchronize the first and second actuators to maintain oscillation of the first magnetron along the first path.

13. A physical vapor deposition (PVD) chamber, comprising:
a pedestal disposed within a processing region of the PVD chamber, the pedestal having an upper surface that is configured to support a substrate thereon;
a first motor coupled to the pedestal, the first motor configured to rotate the pedestal about a first axis that is perpendicular to at least a portion of the upper surface of the pedestal;
a lid assembly comprising a first target, wherein
a surface of the first target defines a portion of the processing region, and comprises a first target material;
a surface area of the upper surface of the pedestal is greater than a surface area of the surface of the first target; and
the surface of the first target is tilted at a first angle in relation to a plane of the upper surface of the pedestal; and
a first magnetron disposed over a portion of the first target, and in a region of the lid assembly that is maintained at atmospheric pressure;
a first actuator configured to oscillate the first magnetron in a radial direction that extends from a central axis of the PVD chamber;
a second actuator configured to oscillate the first magnetron in a circumferential direction centered about a second axis;
a hinge that is directly coupled to both the first actuator and the second actuator; and
a computer readable medium storing instructions that when executed by a processor of a system, cause the system to simultaneously and independently cause:
the first motor to rotate the pedestal about the first axis;
the first actuator to oscillate the first magnetron in the radial direction; and
the second actuator to oscillate the first magnetron in the circumferential direction.

14. The PVD chamber of claim 13, wherein
the second axis is disposed a distance from the first magnetron when measured relative to a plane that is perpendicular to the second axis.

15. The PVD chamber of claim 14, wherein the first and second actuators are configured to cause the first magnetron to oscillate along at least a portion of a first path by causing the first and second actuators to simultaneously oscillate the first magnetron.

16. The PVD chamber of claim 13, wherein an edge of the first target comprises three corners, and one of the three corners is radially positioned closer to the first axis than the two other corners.

17. The PVD chamber of claim 16, wherein the first target further comprises a first backing plate having one or more cooling channels therein configured to receive a coolant therethrough for cooling the first target.

18. A processing system, comprising:
a transfer chamber; and
a physical vapor deposition (PVD) chamber coupled to the transfer chamber, the PVD chamber comprising:
a pedestal disposed within a processing region of the PVD chamber, the pedestal having an upper surface that is configured to support a substrate thereon;
a first motor coupled to the pedestal, the first motor configured to rotate the pedestal about a first axis that is perpendicular to at least a portion of the upper surface of the pedestal;
a lid assembly comprising a first target, wherein
a surface of the first target defines a portion of the processing region, and comprises a first target material;
a surface area of the upper surface of the pedestal is greater than a surface area of the surface of the first target;
the surface of the first target is tilted at a first angle in relation to a plane of the upper surface of the pedestal; and
the first target further comprises a first backing plate having one or more cooling channels therein configured to receive a coolant therethrough for cooling the first target;
a first magnetron disposed over a portion of the first target, and in a region of the lid assembly that is maintained at atmospheric pressure;
a first actuator configured to oscillate the first magnetron in a radial direction;
a second actuator configured to oscillate the first magnetron in a circumferential direction about a second axis;
a hinge that is directly coupled to both the first actuator and the second actuator; and
a system controller that is configured to cause the first magnetron to oscillate along at least a portion of a first path by causing the first actuator and second actuator to simultaneously and simultaneously oscillate the first magnetron.

\* \* \* \* \*

UNITED STATES PATENT AND TRADEMARK OFFICE
CERTIFICATE OF CORRECTION

PATENT NO. : 11,948,784 B2
APPLICATION NO. : 17/507252
DATED : April 2, 2024
INVENTOR(S) : Harish Penmethsa, Hong S. Yang and Suresh Palanisamy Page 1 of 1

It is certified that error appears in the above-identified patent and that said Letters Patent is hereby corrected as shown below:

In the Claims

Column 19, Claim 18, Line 2, after "simultaneously and" delete "simultaneously" and insert -- independently --, therefor.

Signed and Sealed this
Twenty-seventh Day of August, 2024

Katherine Kelly Vidal
*Director of the United States Patent and Trademark Office*